United States Patent
Katada et al.

(10) Patent No.: US 8,223,463 B2
(45) Date of Patent: Jul. 17, 2012

(54) MAGNETIC READ HEAD

(75) Inventors: Hiroyuki Katada, Kanagawa (JP);
Masato Shiimoto, Kanagawa (JP);
Hiroyuki Hoshiya, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 365 days.

(21) Appl. No.: 12/579,854

(22) Filed: Oct. 15, 2009

(65) Prior Publication Data

US 2010/0091416 A1 Apr. 15, 2010

(30) Foreign Application Priority Data

Oct. 15, 2008 (JP) .................................. 2008-266686

(51) Int. Cl.
*G11B 5/39* (2006.01)
(52) U.S. Cl. .................................................. 360/324.12
(58) Field of Classification Search .................. None
See application file for complete search history.

(56) References Cited

U.S. PATENT DOCUMENTS

| | | | |
|---|---|---|---|
| 6,943,997 B2 * | 9/2005 | Gill | 360/324.12 |
| 7,397,637 B2 * | 7/2008 | Gill | 360/324.12 |
| 7,405,909 B2 * | 7/2008 | Gill | 360/324.12 |
| 7,436,632 B2 * | 10/2008 | Li et al. | 360/315 |
| 7,460,343 B2 * | 12/2008 | Carey et al. | 360/324.12 |
| 7,522,391 B2 * | 4/2009 | Freitag et al. | 360/324.12 |
| 7,593,196 B2 * | 9/2009 | Gill | 360/324.11 |
| 7,697,242 B2 * | 4/2010 | Gill | 360/314 |
| 7,872,837 B2 * | 1/2011 | Gill | 360/324.11 |
| 2004/0207963 A1 * | 10/2004 | Gill | 360/324.12 |
| 2005/0243474 A1 * | 11/2005 | Gill | 360/324.1 |

FOREIGN PATENT DOCUMENTS

JP 2002/151758 5/2002

* cited by examiner

*Primary Examiner* — Mark Blouin
(74) *Attorney, Agent, or Firm* — Zilka-Kotab, PC

(57) ABSTRACT

A magnetoresistive head which has a high head SNR by reducing generated mag-noise without deteriorating an output comprises, according to one embodiment, a magnetoresistive sensor having a laminated structure which includes an antiferromagnetic layer, a magnetization pinned layer, a non-magnetic intermediate layer, a magnetization free layer, and a magnetization stable layer arranged adjacent to the magnetization free layer. The magnetization stable layer comprises non-magnetic coupling layer, a first ferromagnetic stable layer, an antiparallel coupling layer, and a second ferromagnetic stable layer. A magnetization quantity of a first ferromagnetic stable layer and a second ferromagnetic stable layer are substantially equal, and the magnetization of the first ferromagnetic stable layer and the second ferromagnetic stable layer are magnetically coupled in the antiparallel direction from each other. The magnetizations of the first ferromagnetic stable layer and the free layer are coupled in an antiferromagnetic or a ferromagnetic alignment.

16 Claims, 12 Drawing Sheets

MAGNETIC READ HEAD

RELATED APPLICATIONS

The present application claims priority to a Japanese Patent Application filed Oct. 15, 2008, under Appl. No. 2008-266686, which is incorporated herein by reference.

FIELD OF THE INVENTION

The present invention relates to magnetic storage devices and more particularly to a magnetic head used in high-recording-density magnetic storage devices.

BACKGROUND OF THE INVENTION

A magnetoresistive head is used as a read sensor in high-recording-density magnetic recording techniques which include a hard disk as a main field, and is a part which largely influences the performance of the magnetic recording technique. It is well-known in the art that a multilayered film which is formed by stacking ferromagnetic metal layers separated by non-magnetic metal layers exhibits a large magnetoresistive effect, that is, a so-called giant magnetoresistive (GMR) effect. With respect to the magnetoresistive effect, the electric resistance changes depending on the magnetizations of two ferromagnetic layers which sandwich a non-magnetic intermediate layer therebetween and an angle made by these magnetizations. As a technique for using this giant magnetoresistive effect in a magnetoresistive element, a structure which is referred to as a spin valve has been used. The spin valve structure comprises an antiferromagnetic layer, a ferromagnetic layer, a non-magnetic intermediate layer, and a ferromagnetic layer. The magnetization of the ferromagnetic layer which is in contact with the antiferromagnetic layer is substantially pinned due to an exchange-coupling magnetic field generated on an interface between the antiferromagnetic layer and the ferromagnetic layer, and the magnetization of another ferromagnetic layer may be rotated freely by an external magnetic field, thus obtaining an output. The ferromagnetic layer whose magnetization is substantially pinned by the antiferromagnetic layer is referred to as the magnetization pinned layer, and the ferromagnetic layer whose magnetization may be rotated by the external magnetic field is referred to as the magnetization free layer.

The above-mentioned basic construction is shared in common by GMRs, specifically current-in-plane (CIP) GMRs, tunnel magnetoresistive (TMR) sensors, and current-perpendicular-to-plane (CPP) GMRs. Further, the read sensor includes a pair of magnetic shields which sandwiches the above-mentioned magnetoresistive sensor for selecting a magnetic field to be sensed from all external magnetic fields.

With respect to the magnetoresistive head, it is well-known that the magnetization of the magnetization free layer is thermally fluctuated at random due to heat, thus generating noise. The noise is referred to as mag-noise. A magnitude of the mag-noise is proportional to the inverse number of a square root of a volume of the magnetization free layer. The larger a storage capacity of a magnetic storage device, such as a hard disk, (e.g., the higher the areal density of information written in a recording medium mounted on the magnetic storage device), the smaller a size of a magnetoresistive head for reading information needs to become. Accordingly, as the areal density of information is increased, the volume of the magnetization free layer is decreased and hence, the mag-noise is increased. As a result, there arises a drawback in that a head signal to noise ratio (SNR) of the read sensor is deteriorated.

SUMMARY OF THE INVENTION

According to one embodiment, a magnetic read head comprises a magnetoresistive sensor. The magnetoresistive sensor has a laminated structure which comprises: a magnetization pinned layer; a non-magnetic intermediate layer; a magnetization free layer; and a magnetization stable layer. The magnetization stable layer comprises: a non-magnetic coupling layer; a first ferromagnetic stable layer; an antiparallel coupling layer; and a second ferromagnetic stable layer. A magnetization of the first ferromagnetic stable layer and a magnetization of the second ferromagnetic stable layer are coupled in an antiparallel alignment by the antiparallel coupling layer, and a magnetization of the magnetization free layer and a magnetization of the first ferromagnetic stable layer are coupled in an antiparallel alignment by the non-magnetic coupling layer. Also, magnetization quantities of the first ferromagnetic stable layer and magnetization quantities of the second ferromagnetic stable layer are substantially equal.

In another embodiment, a magnetic read head comprises a magnetoresistive sensor. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; an antiparallel coupling layer; and a second ferromagnetic stable layer. A magnetization of the first ferromagnetic stable layer and a magnetization of the second ferromagnetic stable layer are coupled in an antiparallel alignment by the antiparallel coupling layer, and a magnetization of the magnetization free layer and a magnetization of the first ferromagnetic stable layer are coupled in a parallel alignment by the non-magnetic coupling layer. Also, magnetization quantities of the first ferromagnetic stable layer and magnetization quantities of the second ferromagnetic stable layer are substantially equal.

According to yet another embodiment, a magnetic read head comprises: a magnetoresistive sensor; and a first magnetic shield and a second magnetic shield which are positioned such that the magnetoresistive sensor is therebetween. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; an antiparallel coupling layer; and a second ferromagnetic stable layer. A magnetization of the first ferromagnetic stable layer and a magnetization of the second ferromagnetic stable layer are coupled in an antiparallel alignment by the antiparallel coupling layer, and a magnetization of the magnetization free layer and a magnetization of the first ferromagnetic stable layer are coupled in an antiparallel alignment by the non-magnetic coupling layer. Also, the first magnetic shield is closer to the magnetization free layer, the second magnetic shield is closer to the magnetization pinned layer, and a distance between the first magnetic shield and the second ferromagnetic stable layer is d, a magnetization of the first ferromagnetic stable layer is M3, and a magnetization of the second ferromagnetic stable layer is M5, wherein $0.9/(M5/M3-0.7) \leq d \leq 1.1/(M5/M3-1.1)$ is satisfied.

In yet another embodiment, a magnetic read head comprises: a magnetoresistive sensor; and a first magnetic shield and a second magnetic shield which are positioned such that the magnetoresistive sensor is therebetween. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; an antiparallel coupling layer; and a second ferromagnetic stable layer. A magnetization of the first ferromagnetic stable layer and a magnetization of the second ferromagnetic stable layer are coupled in an antiparallel alignment by the antiparallel coupling layer, and a magnetization of the magnetization free layer and a magnetization of the first ferromagnetic stable layer are coupled in a parallel alignment by the non-magnetic coupling layer. Also, the first magnetic shield is closer to the magnetization free layer, the second magnetic shield is closer to the magnetization pinned layer, and a distance between the first magnetic shield and the second ferromagnetic stable layer is d, a magnetization of the first ferromagnetic stable layer is M3, and a magnetization of the second ferromagnetic stable layer is M5, wherein $0.9/(M5/M3-0.7) \leq d \leq 1.1/(M5/M3-1.1)$ is satisfied.

According to one embodiment, a magnetic read head comprises: a magnetoresistive sensor; and a first magnetic shield and a second magnetic shield which are positioned such that the magnetoresistive sensor is therebetween. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; and a plurality of laminate layers formed adjacent the first ferromagnetic stable layer, each laminate layer comprising: an antiparallel coupling layer; and a ferromagnetic stable layer, wherein each antiparallel coupling layer is positioned between neighboring ferromagnetic stable layers. A magnetization of the neighboring ferromagnetic stable layers are coupled in an antiparallel alignment by the antiparallel coupling layer, and the magnetization free layer and the first ferromagnetic stable layer are coupled to each other by way of the non-magnetic coupling layer such that a magnetization of the magnetization free layer and a magnetization of the first ferromagnetic stable layer are antiparallel to each other. Also, respective magnetization quantities of all ferromagnetic stable layers are substantially equal, and the first magnetic shield is closer to the magnetization free layer, the second magnetic shield is closer to the magnetization pinned layer, and a distance between the first magnetic shield and a ferromagnetic stable layer farthest from the non-magnetic coupling layer is d, a magnetization of the ferromagnetic stable layer second farthest from the non-magnetic coupling layer is M6, and a magnetization of the ferromagnetic stable layer farthest from the non-magnetic coupling layer is M7, and wherein $0.9/(M7/M6-0.7) \leq d \leq 1.1/(M7/M6-1.1)$ is satisfied.

According to another embodiment, a magnetic read head comprises: a magnetoresistive sensor; and a first magnetic shield and a second magnetic shield which are positioned such that the magnetoresistive sensor is therebetween. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; and a plurality of laminate layers formed adjacent the first ferromagnetic stable layer, each laminate layer comprising: an antiparallel coupling layer; and a ferromagnetic stable layer, wherein each antiparallel coupling layer is positioned between neighboring ferromagnetic stable layers. A magnetization of the neighboring ferromagnetic stable layers are coupled in an antiparallel alignment by the antiparallel coupling layer, and the magnetization free layer and the first ferromagnetic stable layer are coupled to each other by way of the non-magnetic coupling layer such that a magnetization of the magnetization free layer and a magnetization of the first ferromagnetic stable layer are parallel to each other. Also, respective magnetization quantities of all ferromagnetic stable layers are substantially equal, and the first magnetic shield is closer to the magnetization free layer, the second magnetic shield is closer to the magnetization pinned layer, and a distance between the first magnetic shield and a ferromagnetic stable layer farthest from the non-magnetic coupling layer is d, a magnetization of the ferromagnetic stable layer second farthest from the non-magnetic coupling layer is M6, and a magnetization of the ferromagnetic stable layer farthest from the non-magnetic coupling layer is M7, and wherein $0.9/(M7/M6-0.7) \leq d \leq 1.1/(M7/M6-1.1)$ is satisfied.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
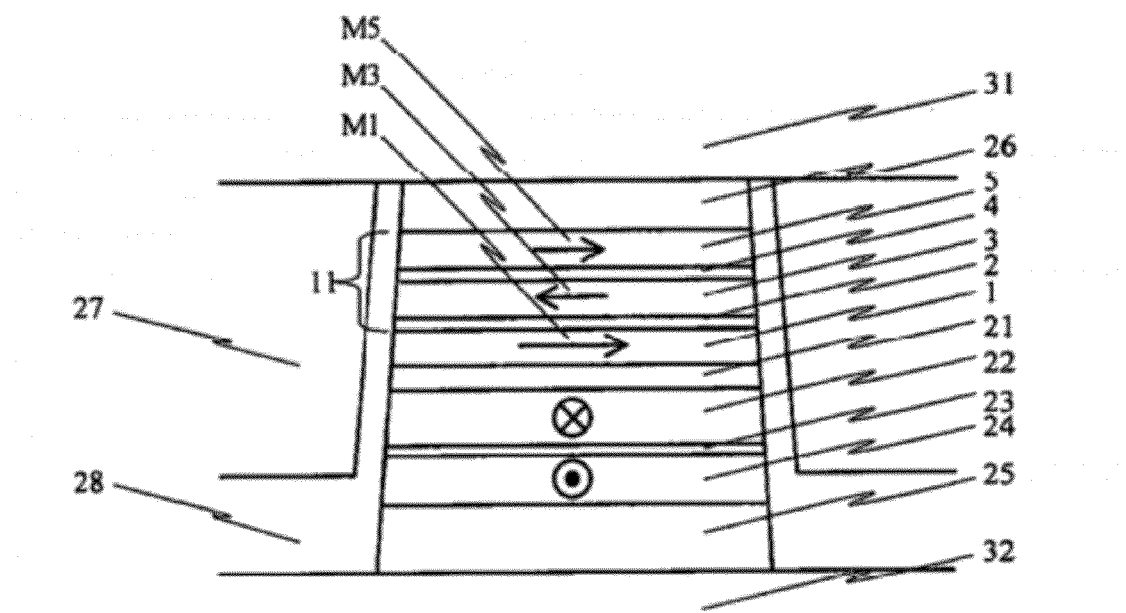
FIG. 1 is a view showing a constitutional example of a magnetoresistive head of the present invention.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

According to one general embodiment, a magnetic read head comprises a magnetoresistive sensor. The magnetoresistive sensor has a laminated structure which comprises: a magnetization pinned layer; a non-magnetic intermediate layer; a magnetization free layer; and a magnetization stable layer. The magnetization stable layer comprises: a non-magnetic coupling layer; a first ferromagnetic stable layer; an antiparallel coupling layer; and a second ferromagnetic stable layer. A magnetization of the first ferromagnetic stable layer and a magnetization of the second ferromagnetic stable layer are coupled in an antiparallel alignment by the antiparallel coupling layer, and a magnetization of the magnetization free layer and a magnetization of the first ferromagnetic stable layer are coupled in an antiparallel alignment by the non-magnetic coupling layer. Also, magnetization quantities of the first ferromagnetic stable layer and magnetization quantities of the second ferromagnetic stable layer are substantially equal.

According to another general embodiment, a magnetic read head comprises a magnetoresistive sensor. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; an antiparallel coupling layer; and a second ferromagnetic stable layer. A magnetization of the first ferromagnetic stable layer and a magnetization of the second ferromagnetic stable layer are coupled in an antiparallel alignment by the antiparallel coupling layer, and a magnetization of the magnetization free layer and a magnetization of the first ferromagnetic stable layer are coupled in a parallel alignment by the non-magnetic coupling layer. Also, magnetization quantities of the first ferromagnetic stable layer and magnetization quantities of the second ferromagnetic stable layer are substantially equal.

According to yet another general embodiment, a magnetic read head comprises: a magnetoresistive sensor; and a first magnetic shield and a second magnetic shield which are positioned such that the magnetoresistive sensor is therebetween. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; an antiparallel coupling layer; and a second ferromagnetic stable layer. A magnetization of the first ferromagnetic stable layer and a magnetization of the second ferromagnetic stable layer are coupled in an antiparallel alignment by the antiparallel coupling layer, and a magnetization of the magnetization free layer and a magnetization of the first ferromagnetic stable layer are coupled in an antiparallel alignment by the non-magnetic coupling layer. Also, the first magnetic shield is closer to the magnetization free layer, the second magnetic shield is closer to the magnetization pinned layer, and a distance between the first magnetic shield and the second ferromagnetic stable layer is d, a magnetization of the first ferromagnetic stable layer is M3, and a magnetization of the second ferromagnetic stable layer is M5, wherein $0.9/(M5/M3-0.7) \leq d \leq 1.1/(M5/M3-1.1)$ is satisfied.

According to another general embodiment, a magnetic read head comprises: a magnetoresistive sensor; and a first magnetic shield and a second magnetic shield which are positioned such that the magnetoresistive sensor is therebetween. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; an antiparallel coupling layer; and a second ferromagnetic stable layer. A magnetization of the first ferromagnetic stable layer and a magnetization of the second ferromagnetic stable layer are coupled in an antiparallel alignment by the antiparallel coupling layer, and a magnetization of the magnetization free layer and a magnetization of the first ferromagnetic stable layer are coupled in a parallel alignment by the non-magnetic coupling layer. Also, the first magnetic shield is closer to the magnetization free layer, the second magnetic shield is closer to the magnetization pinned layer, and a distance between the first magnetic shield and the second ferromagnetic stable layer is d, a magnetization of the first ferromagnetic stable layer is M3, and a magnetization of the second ferromagnetic stable layer is M5, wherein $0.9/(M5/M3-0.7) \leq d \leq 1.1/(M5/M3-1.1)$ is satisfied.

According to one general embodiment, a magnetic read head comprises: a magnetoresistive sensor; and a first magnetic shield and a second magnetic shield which are positioned such that the magnetoresistive sensor is therebetween. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; and a plurality of laminate layers formed adjacent the first ferromagnetic stable layer, each laminate layer comprising: an antiparallel coupling layer; and a ferromagnetic stable layer, wherein each antiparallel coupling layer is positioned between neighboring ferromagnetic stable layers. A magnetization of the neighboring ferromagnetic stable layers are coupled in an antiparallel alignment by the antiparallel coupling layer, and the magnetization free layer and the first ferromagnetic stable layer are coupled to each other by way of the non-magnetic coupling layer such that a magnetization of the magnetization free layer and a magnetization of the first ferromagnetic stable layer are antiparallel to each other. Also, respective magnetization quantities of all ferromagnetic stable layers are substantially equal, and the first magnetic shield is closer to the magnetization free layer, the second magnetic shield is closer to the magnetization pinned layer, and a distance between the first magnetic shield and a ferromagnetic stable layer farthest from the non-magnetic coupling layer is d, a magnetization of the ferromagnetic stable layer second farthest from the non-magnetic coupling layer is M6, and a magnetization of the ferromagnetic stable layer farthest from the non-magnetic coupling layer is M7, and wherein $0.9/(M7/M6-0.7) \leq d \leq 1.1/(M7/M6-1.1)$ is satisfied.

According to one general embodiment, a magnetic read head comprises: a magnetoresistive sensor; and a first magnetic shield and a second magnetic shield which are positioned such that the magnetoresistive sensor is therebetween. The magnetoresistive sensor has a laminated structure comprising: a magnetization pinned layer; a non-magnetic intermediate layer; a magnetization free layer; and a magnetization stable layer. The magnetization stable layer comprises: a non-magnetic coupling layer; a first ferromagnetic stable layer; and a plurality of laminate layers formed adjacent the first ferromagnetic stable layer, each laminate layer comprising: an antiparallel coupling layer; and a ferromagnetic stable layer, wherein each antiparallel coupling layer is positioned between neighboring ferromagnetic stable layers. A magnetization of the neighboring ferromagnetic stable layers are coupled in an antiparallel alignment by the antiparallel coupling layer, and the magnetization free layer and the first ferromagnetic stable layer are coupled to each other by way of the non-magnetic coupling layer such that a magnetization of the magnetization free layer and a magnetization of the first ferromagnetic stable layer are parallel to each other. Also, respective magnetization quantities of all ferromagnetic stable layers are substantially equal, and the first magnetic shield is closer to the magnetization free layer, the second magnetic shield is closer to the magnetization pinned layer, and a distance between the first magnetic shield and a ferromagnetic stable layer farthest from the non-magnetic coupling layer is d, a magnetization of the ferromagnetic stable layer second farthest from the non-magnetic coupling layer is M6, and a magnetization of the ferromagnetic stable layer farthest from the non-magnetic coupling layer is M7, and wherein $0.9/(M7/M6-0.7) \leq d \leq 1.1/(M7/M6-1.1)$ is satisfied.

To achieve a high areal density may be accomplished by producing a high signal-to-noise ratio (SNR) with a lowering of the mag-noise generated in a magnetoresistive head. According to one embodiment, a magnetoresistive head uses a spin-valve-type magnetoresistive laminated structure which includes a sensor having the laminated structure which is comprised of an antiferromagnetic layer, a magnetization pinned layer, a non-magnetic intermediate layer, a magnetization free layer, and a magnetization stable layer. The antiferromagnetic layer is a layer to which an exchange coupling bias for substantially fixing the magnetization of the magnetization pinned layer is applied. The magnetoresistive head may accomplish a read effect by directly adhering the antiferromagnetic layer to the magnetization pinned layer as well as by indirectly adhering the antiferromagnetic layer by way of magnetic coupling. Alternatively, in place of the antiferromagnetic layer, other bias applying methods, such as residual magnetization of a hard magnetic film or a current bias, for example, may be used. The magnetization pinned layer may be formed of a synthetic ferri-pinned layer in which a first pinned layer and a second pinned layer are coupled to each other by way of the antiparallel coupling layer such that the magnetization of the first pinned layer and the magnetization of the second pinned layer become antiparallel to each other. Here, such coupling may be sufficiently large compared to a magnetic field to be sensed. To be more specific, a magnitude of the antiparallel coupling magnetic field may be a value which falls within a range from approximately several hundred to several thousand oersteds (Oe). As a result, the magnetization of the second magnetization pinned layer is pinned with respect to a magnetic field to be sensed. The magnetization of the magnetization free layer changes direction in response to a magnetic field to be sensed. An output is generated due to a relative angle between the magnetization of the magnetization free layer which changes in response to the magnetic field to be sensed and the magnetization of the magnetization pinned layer or the second pinned layer which fixes the magnetization with respect to the magnetic field to be sensed. Further, bias layers may be arranged so as to form the magnetization free layer as a single magnetic domain. The bias layers are formed of a high coercivity film preferably having a sufficiently large coercivity with respect to a magnetic field to be sensed, wherein edge portions of the respective bias layers are arranged close to edge portions of the magnetization free layer in the track width direction.

The volume of the magnetization free layer may be increased by increasing a film thickness of the magnetization free layer for suppressing the deterioration of the head SNR attributed to the increase of mag-noise. However, such an attempt gives rise to the following drawbacks. One drawback is that a ratio of magnetization quantity of the magnetization free layer to a magnitude of a signal magnetic field to be sensed from the recording medium is increased so that sensitivity for a signal magnetic field to be sensed by the magnetization free layer, such as a reproduction output, is lowered. As a result, even the increase of the mag-noise can be suppressed and an output of the magnetoresistive head may be lowered so that the SNR is deteriorated. Another drawback is that an applied magnetic field from a bias layer which performs a stabilization of the magnetization free layer is lowered relatively; therefore, an effective anisotropic magnetic field of the magnetization free layer is decreased. As a result, there arises a drawback that even when the volume of the magnetization free layer is increased, the mag-noise is not decreased.

According to some embodiments, a magnetoresistive head is provided which can realize a high head SNR by lowering mag-noise generated in the magnetoresistive head without deteriorating an output thereof.

The magnetization stable layer is arranged adjacent to the magnetization free layer, according to some embodiments. The magnetization stable layer has a stacked structure and is comprised of a non-magnetic coupling layer, a first ferromagnetic stable layer, an antiparallel coupling layer, and a second ferromagnetic stable layer. The magnetization free layer and the non-magnetic coupling layer of the magnetization stable layer are arranged adjacent to each other. Here, a magnetization quantity of the first ferromagnetic stable layer and a magnetization quantity of the second ferromagnetic stable layer are substantially equal, and the magnetization of the first ferromagnetic stable layer and the magnetization of the second ferromagnetic stable layer are magnetically coupled by way of the antiparallel coupling layer such that the respective magnetizations are directed in the antiparallel direction from each other. This coupling may be sufficiently large with respect to a magnetic field to be sensed. The magnetization of the first ferromagnetic stable layer and the magnetization of the magnetization free layer are magnetically coupled by way of the non-magnetic coupling layer. Here, the magnetization of the magnetization free layer and the magnetization of the first ferromagnetic stable layer may be coupled in an antiferromagnetic alignment such that the magnetization of the magnetization free layer and the magnetization of the first ferromagnetic stable layer become antiparallel to each other. Alternatively, the magnetization of the magnetization free layer and the magnetization of the first ferromagnetic stable layer may be coupled in a ferromagnetic alignment such that the magnetization of the magnetization free layer and the magnetization of the first ferromagnetic stable layer become parallel to each other. This coupling may be sufficiently large with respect to a magnetic field to be sensed.

According to one embodiment, the magnetization of the magnetization free layer, the magnetization of the first ferromagnetic stable layer, and the magnetization of the second ferromagnetic stable layer are magnetically coupled to each other; therefore, these layers behave integrally. Accordingly, the provision of the magnetization stable layer is equivalent to the increase of the effective volume of the magnetization free layer; therefore, the mag-noise can be reduced. Further, from a viewpoint of sensitivity to a signal magnetic field, the magnetization quantities of the first ferromagnetic stable layer and the magnetization quantities of the second ferromagnetic stable layer are substantially equal in magnitude and are antiparallel to each other hence, the magnetization quantities of the first and second ferromagnetic stable layers substantially offset each other whereby the sensitivity of the read head is preferably determined based on only the magnetization quantity of the magnetization free layer. That is, the magnetoresistive head can obtain an output equal to an output which is obtained when the magnetoresistive head is not provided with the magnetization stable layer. In this manner, the magnetoresistive head having the magnetization stable layer can reduce the head noise while holding the output at a fixed level—thus realizing a high head SNR.

In one approach, a magnetoresistive-effect-type head includes a pair of magnetic shields which sandwiches a spin valve element, such as those described herein. The magnetic shield on a magnetization free layer side is referred to as a first magnetic shield and the magnetic shield on a magnetization pinned layer side is referred to as a second magnetic shield. When a distance between the first magnetic shield and the magnetization stable layer is small, allowing the magnetization of the first ferromagnetic stable layer and the magnetization of the second ferromagnetic stable layer to substantially offset each other, there may be a situation where it is desirable to provide a difference between the magnetization quantity of the first ferromagnetic stable layer and the magnetization quantity of the second ferromagnetic stable layer. The reason is as follows. When the first magnetic shield and the second ferromagnetic stable layer are spaced apart from each other, a magnetic field which is generated from a track end of the second ferromagnetic stable layer and a magnetic field which is generated from a track end of the first ferromagnetic stable layer comprise a closed magnetic circuit. In contrast, when the distance between the second ferromagnetic stable layer and the first magnetic shield is small, a portion of the magnetic field generated from the track end of the second ferromagnetic stable layer is attracted by the first magnetic shield. As a result, a balance of the closed magnetic circuit collapses and magnetostatic coupling between the first ferromagnetic stable layer and the second ferromagnetic stable layer is weakened; therefore, the magnetization free layer, the first ferromagnetic stable layer, and the second ferromagnetic stable layer do not behave integrally thereby increasing the noise. In this situation, by properly increasing the magnetization quantity of the second ferromagnetic stable layer due to the increase of a film thickness or the use of a material which possesses large saturated magnetization, for example, and by constituting the closed magnetic circuit by the first ferromagnetic stable layer, the second ferromagnetic stable layer and the first magnetic shield, it is possible to make the magnetization quantity of the first ferromagnetic stable layer and the magnetization quantity of the second ferromagnetic stable layer offset each other. To be more specific, assuming a distance between the first magnetic shield and the second ferromagnetic stable layer as d, the magnetization of the first ferromagnetic stable layer as M3, and the magnetization of the second ferromagnetic stable layer as M5, Equation 1 may be satisfied.

$$0.9/(M5/M3-0.7) \leq d \leq 1.1(M5/M3-1.1) \quad \text{Equation 1}$$

In another approach, the magnetization stable layer and the ferromagnetic stable layer may have the multi-layered structure of two or more layers, and the antiparallel coupling layer may be inserted between the respective magnetization stable layers. Also in this situation, it is desirable that the magnetizations of the ferromagnetic stable layers are coupled in an antiparallel alignment by the antiparallel coupling layer and hence, the magnetization quantities of the ferromagnetic stable layers offset each other as a whole, thus comprising a closed magnetic circuit.

According to some embodiments, the magnetoresistive head can acquire a high head SNR by reducing thermally-fluctuated noise without lowering a reproduction output.

A thin film which comprises a giant magnetoresistive-effect stacked film, according to one embodiment may be prepared as follows using a DC magnetron sputtering device. The thin film may be formed by sequentially stacking the following materials on a ceramic substrate in an Argon atmosphere of 1 to 6 mTorr (0.1 to 0.8 Pa). As sputtering targets, respective targets comprising tantalum, an iron alloy containing about 20% nickel, copper, Co—Fe, MnPt, ruthenium, alumina, MnIr and MnIrCr may be used. In forming the stacked-layer film, respective high-frequency powers may be applied to a cathode on which respective targets are arranged, thereby generating plasmas in the inside of the device, and shutters which are arranged on the respective cathodes may be opened or closed one after another, thus forming the respective layers sequentially. At the time of forming the film, a magnetic field of approximately 50 Oe (6.4 kA/m) may be applied parallel to the substrate using a permanent magnet thus imparting uniaxial anisotropy to the film. The formed film may undergo heat treatment at a temperature of 27° C. for 3 hours in a vacuum and in a magnetic field thus performing the magnetization treatment of exchange-coupling magnetic fields of MnPt, MnIr or MnIrCr antiferromagnetic films. Then, the magnetic resistances of these films at room temperature are measured and evaluated. Elements may be formed on the substrate by patterning using a photoresist step. Thereafter, the substrate may undergo slider forming and, then may be mounted on a magnetic recording device.

An output of the manufactured magnetic head is measured read a signal of 100 kFCI written in a magnetic disk in a state that the magnetic head is loaded on a rotatable magnetic disk. Head noise is measured using a spectrum analyzer in a state that the magnetic head is unloaded from the magnetic disk.

FIG. 1 is a schematic view of an exemplary magnetoresistive head, according to one embodiment as viewed from a plane which faces a recording medium. The magnetoresistive head may be formed as follows. An antiferromagnetic layer 25, a first magnetization pinned layer 24, a pinned layer antiparallel coupling layer 23, a second magnetization pinned layer 22, a non-magnetic intermediate layer 21, a magnetization free layer 1, a non-magnetic coupling layer 2, a first ferromagnetic stable layer 3, an antiparallel coupling layer 4, a second ferromagnetic stable layer 5, and a protective layer 26 may be continuously formed. The non-magnetic coupling layer 2, the first ferromagnetic stable layer 3, the antiparallel coupling layer 4, and the second ferromagnetic stable layer 5 are collectively referred to as a magnetization stable layer 11.

The magnetization of the magnetization free layer 1 and the magnetization of the first ferromagnetic stable layer 3 may be coupled in an antiferromagnetic alignment by the non-magnetic coupling layer 2, while the magnetization of the first ferromagnetic stable layer 3 and the magnetization of the second ferromagnetic stable layer 5 may be coupled in an antiferromagnetic alignment by the antiparallel coupling layer 4, according to some embodiments.

Although the magnetization free layer 1, the first ferromagnetic stable layer 3 and the second ferromagnetic stable layer 5 may be formed of a stacked-layer film made of a CoFe alloy and an NiFe alloy, these layers may be formed of a single-layer film or a stacked-layer film made of a material or materials selected from a group consisting of a CoFeB alloy, a CoMnGe Heusler alloy, a CoMnSi Heusler alloy, a CoCrAl Heusler alloy, and a CoFeAl alloy, according to some embodiments. Although the non-magnetic intermediate layer 21 is made of Cu for generating a giant magnetoresistive effect, the non-magnetic intermediate layer 21 may be made of Au, Ag, or an alloy of these metals. Further, the non-magnetic intermediate layer 21 may be made of alumina, titanium oxide, or MgO for generating a tunnel magnetoresistive effect. Although the first magnetization pinned layer 24 and the second magnetization pinned layer 22 may be formed of a CoFe alloy, these layers may be formed of a single-layer film or a stacked-layer film made of a material or materials selected from a group consisting of an NiFe alloy, a CoFeB alloy, a CoMnGe Heusler alloy, a CoMnSi Heusler alloy, a CoCrAl Heusler alloy, and CoFeAl alloy. The first magnetization pinned layer 24 and the second magnetization pinned layer 22 may be made of the same material or may be made using different materials.

The pinned layer antiparallel coupling layer 23 may be made of a material such as Ru, Ir, Cr, Rh, Re, Os, or Pt having a properly selected thickness for coupling the magnetization of the first magnetization pinned layer 24 and the magnetization of the second magnetization pinned layer 22 in an antiferromagnetic alignment, according to some embodiments. It is preferable that a magnitude of the antiferromagnetic coupling is 1 kOe. That is, the strong ferromagnetic coupling of 80 kA/m or more is desirable. The pinned layer antiparallel coupling layer 23 has an effect of fixing the magnetization of the second magnetization pinned layer 22 to a magnetic field to be sensed by applying exchange-coupling which arranges the magnetization of the first magnetization pinned layer 24 and the magnetization of the second magnetization pinned layer 22 in an antiparallel alignment to each other. Here, the formation of the first magnetization pinned layer 24 using a single-layered magnetic body and the formation of the first magnetization pinned layer 24 using a two-layered stacked body or four-or-more-layered stacked body do not depart from the present embodiment.

The non-magnetic coupling layer 2 may be made of Ru having a film thickness of about 0.4 nm for coupling the magnetization of the magnetization free layer 1 and the magnetization of the first ferromagnetic stable layer 3 in an antiferromagnetic alignment, according to some embodiments. However, the non-magnetic coupling layer 2 may be made of a material such as Ir, Cr, Rh, Re, Os, or Pt having a properly selected thickness.

The antiparallel coupling layer 4 may be made of Ru having a film thickness of about 0.4 nm for coupling the magnetization of the first ferromagnetic stable layer 3 and the magnetization of the second ferromagnetic stable layer 5 in an antiferromagnetic alignment, according to some embodiments. However, the antiparallel coupling layer 4 may be made of a material such as Ir, Cr, Rh, Re, Os or Pt having a properly selected thickness.

The order of forming the respective layers may be reversed, according to some embodiments. That is, the magnetoresistive head may be formed in order of: the second ferromagnetic stable layer, the antiparallel coupling layer, the first ferromagnetic stable layer, the non-magnetic coupling layer, the magnetization freelayer, the non-magnetic intermediate layer, the second magnetization pinned layer, the pinned layer, the antiparallel coupling layer, the first magnetization pinned layer, and the antiferromagnetic layer.

A bias layer 27 may be formed on both sides of the magnetoresistive effect film in the track width direction, according to some embodiments. A non-magnetic body 28 may be formed between the bias layer 27 and the magnetization free layer 1. The magnetization free layer 1 may undergo a magnetic domain control by a magnetic field applied from the bias layers 27, and the magnetization free layer 1 may be operated at a desired utilization ratio with respect to a magnetic field to be sensed. The bias layer 27 may be made of a CoPt alloy or a CoPtCr alloy. The crystal structure of these alloys may have a mixed phase of the face-centered cubic structure and the hexagonal close-packed structure in general. The non-magnetic body 28 may be made of an insulation material when the magnetic head is of the current-perpendicular-to-plane (CPP) type, and is made of a conductive material when the magnetic head is of a current-in-plane (CIP) type. As an insulation material, a material such as alumina or silicon oxide may be used. As a conductive material, a metal such as Cr or Cu may be used.

Head noise $N_h$ generated in the read head may be expressed by Equation 2.

$$N_h = (N_c^2 + N_{mag}^2)^{1/2} \qquad \text{Equation 2}$$

$N_c$ indicates electric noise, and the electric noise $N_c$ corresponds to Johnson noise in the situation where an element exhibits a giant magnetoresistive effect, and corresponds to shot noise in the situation where an element exhibits a tunnel magnetoresistive (TMR) effect. $N_{mag}$ indicates thermal fluctuation noise (mag-noise), and the thermal fluctuation noise $N_{mag}$ may be expressed by the following formula.

$$N_{mag} = \Delta R / H_{stiff} (4 K_B T \alpha / \mu_0 M_s V \gamma)^{1/2} \qquad \text{Equation 3}$$

Here, $\Delta R$ indicates a maximum resistance change quantity of the magnetic sensor, $H_{stiff}$ indicates an effective anisotropic magnetic field which the magnetic sensor receives, $K_B (=1.38 \times 10^{-23}$ J/K) indicates the Boltzmann constant, T indicates an element temperature, $\alpha$ indicates the Gilbert damping constant, $\mu_0$ indicates the permeability in vacuum, $M_s$ indicates the saturated magnetization of the free layer, V indicates a volume of a magnetization free layer, and $\gamma (=2.78 \times 10^3$ m/As) indicates a gyro magnetic constant.

Figure 2:
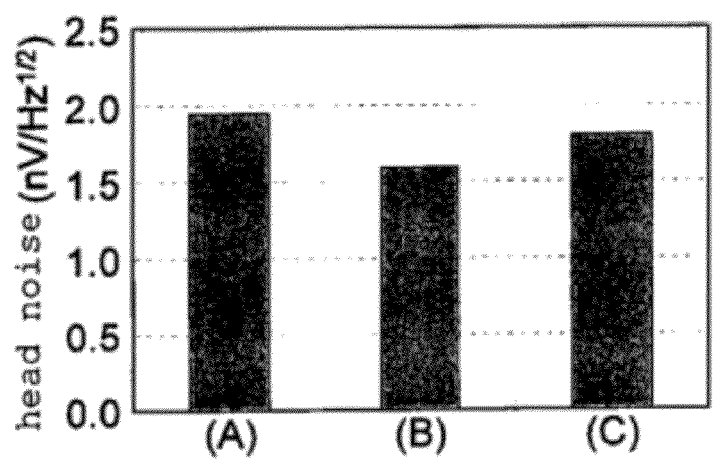
FIG. 2 is a view showing an example of a characteristic of a related art and an example of a characteristic of the present invention.
Figure 3:
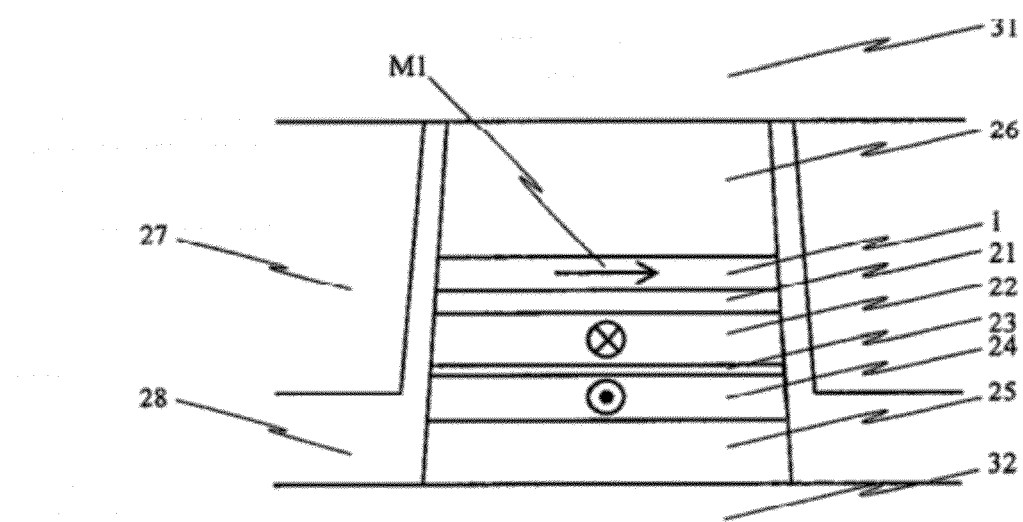
FIG. 3 is a view showing a constitutional example of a magnetoresistive head of the related art
Figure 4:
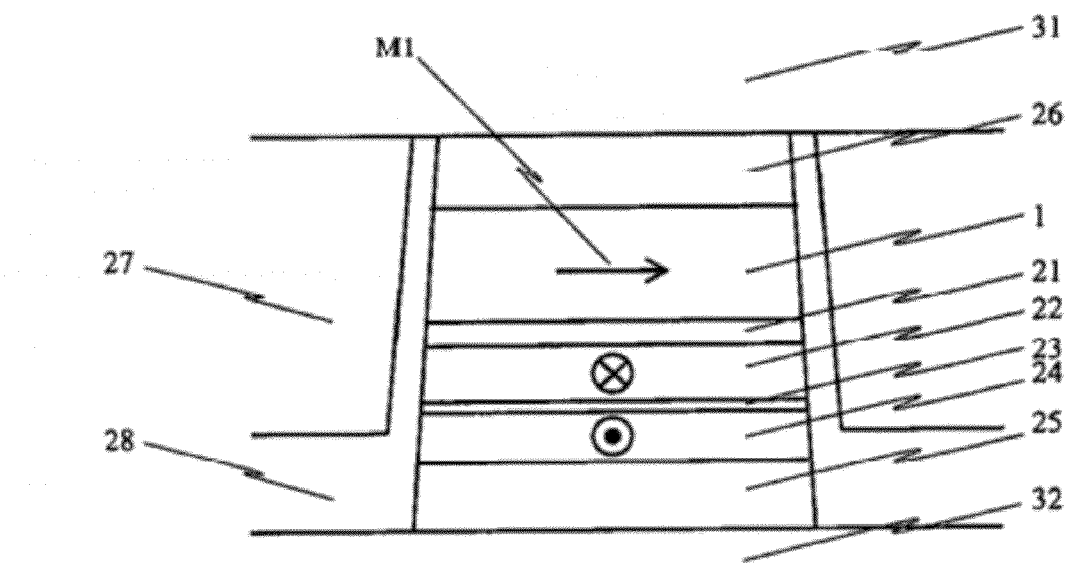
FIG. 4 is a view showing the constitutional example of the magnetoresistive head of the related art.

FIG. 2 is a view showing one example of head noise in the related art and a structure according to one embodiment. (A) indicates a structure according to the related art having no magnetization stable layer, wherein the magnetization free layer has a film thickness of 3 nm, the saturated magnetization of 1000 emu/cm³. FIG. 3 is a schematic view of the structure (A) as viewed from a surface thereof which faces a recording medium. Referring again to FIG. 2, (B) indicates a structure according to one embodiment having a magnetization stable layer, wherein the magnetization free layer has the same film thickness of 3 nm as (A) and the same saturated magnetization of 1000 emu/cm$^3$ as the structure (A), and both of the first ferromagnetic stable layer and the second ferromagnetic stable layer have a film thickness of 2 nm and the saturated magnetization of 1000 emu/cm$^3$. FIG. 1 corresponds to structure (B). Referring again to FIG. 2, (C) indicates a structure of the related art having no magnetization stable layer, wherein the free layer has a film thickness of 7 nm and a saturated magnetization of 1000 emu/cm$^3$, and a magnetization quantity is substantially equal to a magnetization quantity of the structure (B). FIG. 4 is a schematic view of the structure (C) as viewed from a surface thereof which faces a recording medium.

The head noise of the structure (B) having a structure according to one embodiment is small compared to the head noise of the structure (A) of the related art. This is because that, in the structure (B), the magnetization M1 of the magnetization free layer 1 and the magnetization M3 of the first ferromagnetic stable layer 3 are magnetically coupled by way of the non-magnetic coupling layer 2 and hence, the magnetizations M1, M3 of these layers integrally behave and, further, the magnetization M3 of the first ferromagnetic stable layer 3 and the magnetization M5 of the second ferromagnetic stable layer 5 are magnetically coupled by way of the antiparallel coupling layer and hence, the magnetizations M3, M5 integrally behave whereby the magnetizations M1, M3, M5 integrally behave. Accordingly, a value of V in Equation 3 of mag-noise in the structure (B) becomes 7.3 times as large as a value of V of the structure (A). As a result, mag-noise is lowered to $(1/7.3)^{1/2}$ and hence, head noise is lowered. On the other hand, although the magnetic layer of the structure (C) has the same volume as the magnetic layer of the structure (B), the noise is not reduced to a level substantially equal to a level of the noise of the structure (B). Although a film thickness of the magnetization free layer of the structure (e) is larger than a film thickness of the magnetization free layer of the structure (A) so that the value of V of the structure (C) is larger than the value of V of the structure (A), since the film thickness of the magnetization free layer is large, the magnetization quantity of the magnetization free layer is increased whereby a magnetic field which is applied from a bias layer for stabilizing the magnetization free layer is relatively small compared to a corresponding magnetic field of (A). Accordingly, in the structure (C), the effective magnetic anisotropic magnetic field $H_{stiff}$ which is an index indicative of stability of the magnetization free layer becomes small and hence, as can be clearly understood from Equation 3, a mag-noise reduction effect is small in spite of the large value of V. In (B) which indicates a structure, according to one embodiment, the magnetization quantity of the first ferromagnetic stable layer 3 and the magnetization quantity of the second ferromagnetic stable layer 5 are substantially equal and hence, these magnetization quantities offset each other as viewed macroscopically whereby the structure (B) can maintain the substantially equal magnitude of the effective magnetic anisotropic magnetic field $H_{stiff}$. In this manner, (B) which indicates a structure according to one embodiment can increase only the volume V without decreasing $H_{stiff}$ and hence, mag-noise can be reduced and the head noise can be reduced as a result.

Figure 5:
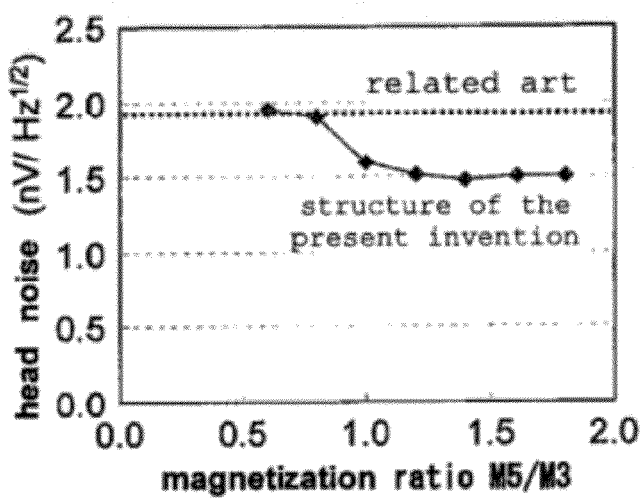
FIG. 5 is a view showing an example of a characteristic of the related art and an example of a characteristic of the present invention.

FIG. 5 shows a change of head noise when a ratio between the magnetization quantity M3 of the first ferromagnetic stable layer 3 and the magnetization quantity M5 of the second ferromagnetic stable layer 5 is changed. The magnetization quantity of each layer is expressed by a product of the saturated magnetization of a material which comprises each layer and a volume of the layer. Accordingly, the saturated magnetization of each layer may be changed, a film thickness of each layer may be changed, or both of the saturated magnetization and the film thickness may be changed. FIG. 5 shows a result when a distance between the second ferromagnetic stable layer 5 and the first magnetic shield 31 is set to about 4 nm. Further, in the drawing, there is also shown a value of head noise in a read head having a structure of the related art with no magnetization stable layer.

When the magnetization ratio M5/M3 between the first ferromagnetic stable layer 3 and the second ferromagnetic stable layer 5 is set to a value larger than about 0.9, head noise which is lower than head noise of the related art is observed. This is because, as described previously, the magnetization of the magnetization free layer 1, the magnetization of the first ferromagnetic stable layer 3, and the magnetization of the second ferromagnetic stable layer 5 may be formed integrally and hence, the effective volume is increased whereby the mag-noise is reduced.

When the magnetization ratio M5/M3 is not more than 1, a magnitude of a static magnetic field applied to a track end of the first ferromagnetic stable layer 3 from a track end of the second ferromagnetic stable layer 5 becomes relatively small. That is, magnetostatic coupling between the first ferromagnetic stable layer 3 and the second ferromagnetic stable layer 5 is weakened. A demagnetizing field is large at the track end so that the deterioration of the magnetostatic coupling at the track end is liable to deteriorate coupling between the first magnetization stable layer 3 and the second magnetization stable layer 5. The magnetization of the first ferromagnetic stable layer 3 is directed in the direction opposite to the direction of a magnetic field applied from the bias layer 27 and hence, the coupling is liable to be deteriorated particularly at the track end. In this manner, the magnetization free layer 1, the first ferromagnetic stable layer 3 and the second ferromagnetic stable layer 5 do not behave completely integrally and hence, the mag-noise is increased to a level substantially equal to a level of the related art.

When the magnetization quantity of the second ferromagnetic stable layer 5 exceeds the magnetization quantity of the first ferromagnetic stable layer 3, that is, when the magnetization ratio M5/M3 is not less than 1, a magnitude of a static magnetic field applied to the second ferromagnetic stable layer 5 becomes relatively small. However, the magnetization direction of the second ferromagnetic stable layer 5 is equal to the direction of a magnetic field applied from the bias layer 27 and hence, there is no possibility that the track end becomes unstable so that the mag-noise is increased.

Figure 6:
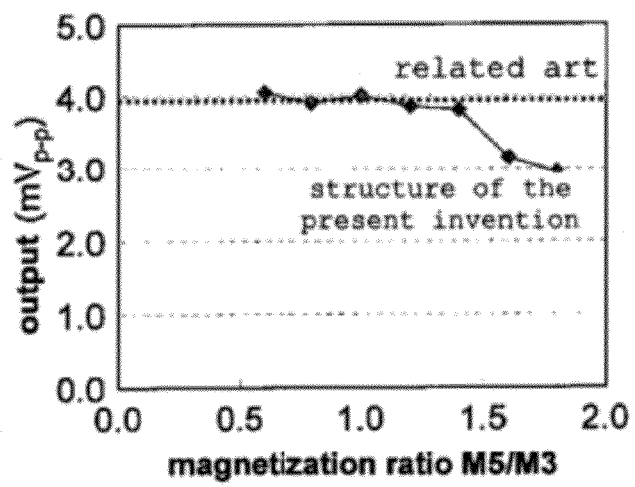
FIG. 6 is a view showing an example of a characteristic of the related art and an example of a characteristic of the present invention.

FIG. 6 shows a change of a reproduction output when the ratio between the magnetization quantity M3 of the first ferromagnetic stable layer 3 and the magnetization quantity M5 of the second ferromagnetic stable layer 5 is changed. FIG. 6 shows a result when a distance between the second ferromagnetic stable layer 5 and the first magnetic shield 31 is set to about 4 nm. Further, in the drawing, there is also shown a value of a reproduction output of a read head having a structure of the related art with no magnetization stable layer 11.

When the magnetization ratio M5/M3 is set to not more than 1.4, the output substantially equal to the output of a structure of the related art is observed. The output $V_{p-p}$ is expressed by Equation 4.

$$V_{p-p} = e \cdot Vb \cdot MR \quad \text{Equation 4}$$

In Equation 4, e indicates the utilization ratio which is a value obtained by dividing a resistance quantity which is changed corresponding to a signal magnetic field from a disk with a maximum resistance change quantity. Vb indicates a drive voltage of a read head, and MR indicates a maximum resistance change ratio.

Even when the magnetization ratio M5/M3 is 1 or more, that is, even when the magnetization quantity of the second ferromagnetic stable layer is larger than the magnetization quantity of the first ferromagnetic stable layer, so long as the magnetization ratio M5/M3 is not more than 1.4, a portion of a static magnetic field generated from the track end of the second ferromagnetic stable layer 5 is attracted by the first magnetic shield thus forming a closed magnetic circuit whereby the magnetization of the first ferromagnetic stable layer 3 and the magnetization of the second ferromagnetic stable layer 5 which are directed in an antiparallel alignment to each other substantially offset each other. As a result, the utilization ratio e of the whole head is determined based on the magnetization quantity of the magnetization free layer 1 even when the magnetic read head includes the magnetization stable layer 11. Accordingly, the utilization ratio e of the whole head becomes substantially equal to the utilization ratio e of the structure of the related art having no magnetization stable layer 11 within this range.

On the other hand, when the magnetization quantity of the second ferromagnetic stable layer 5 becomes 1.4 times as large as the magnetization quantity of the first ferromagnetic stable layer 3 or more, the magnetization of the first ferromagnetic stable layer 3 and the magnetization of the second ferromagnetic stable layer 5 cannot offset each other. In this case, the magnetization direction of the second ferromagnetic stable layer 5 and the magnetization direction of the magnetization free layer 1 are equal and hence, this implies that the magnetization quantity in the same direction as the magnetization direction of the magnetization free layer 1 is increased. Since the magnetization quantity of the magnetization free layer 1 with respect to a signal magnetic field to be sensed is increased, the utilization ratio e is lowered thus lowering an output.

The smaller a distance "d" between the second ferromagnetic stable layer 5 and the first magnetic shield 31, the larger a quantity of a static magnetic field which is generated from the track end of the second ferromagnetic stable layer 5 and the stable layer 5 is attracted by the first magnetic shield 31. Accordingly, the magnetization ratio M5/M3 at which the head noise starts to increase and the magnetization ratio M5/M3 at which the output starts to decrease are increased.

Further, even when a track width or an element height is changed, the relationship between the magnetization ratio M5/M3 at which the head noise starts to increase and the distance "d", and the relationship between the magnetization ratio M5/M3 at which the output starts to decrease and the distance "d" are not changed. A factor which causes the increase of the noise is the lowering of the magnetostatic coupling at the track end. That is, only the magnetization which is generated at the track end is important. Further, a factor which causes the lowering of the output is that the magnetization of the first ferromagnetic stable layer 3 and the magnetization of the second ferromagnetic stable layer 5 do not substantially offset each other. That is, only the ratio between the magnetization of the first ferromagnetic stable layer 3 and the magnetization of the second ferromagnetic stable layer 5 matter. Accordingly, the increase of noise does not depend on a length of the layer, that is, the track width or the element height. Further, only the magnetization ratio between the first ferromagnetic stable layer 3 and the magnetization of the second ferromagnetic stable layer 5 matters and hence, the increase of noise also does not depend on the magnetization quantity, the saturated magnetization, and the film thickness of the magnetization free layer 1.

Figure 7:
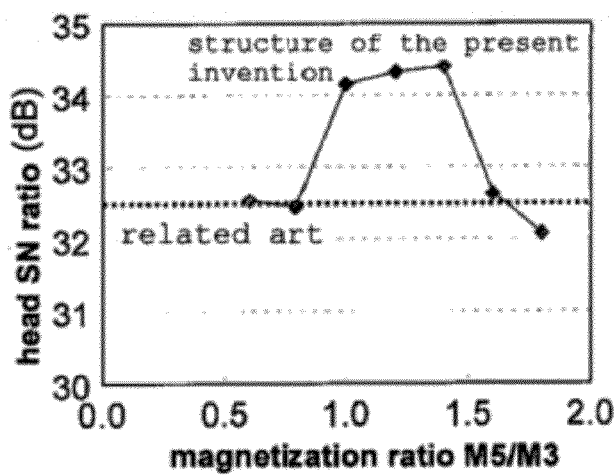
FIG. 7 is a view showing an example of a characteristic of the related art and an example of a characteristic of the present invention.

FIG. 7 shows the relationship between the head SNR calculated based on the noise shown in FIG. 5 and the output shown in FIG. 6 and the magnetization ratio M5/M3 (d=4 nm).

The head SNR is expressed by Equation 5.

$$\text{Head } SN = 20 \times \log(V_{o\text{-}p}/N_b) \qquad \text{Equation 5}$$

The structure, according to one embodiment, exhibits a high head SNR compared to the related art having no magnetization stable layer when the magnetization ratio M5/M3 falls within a range from not less than 1.0 to not more than 1.4. This range is a range which allows the reduction of mag-noise without lowering the reproduction output.

Figure 8:
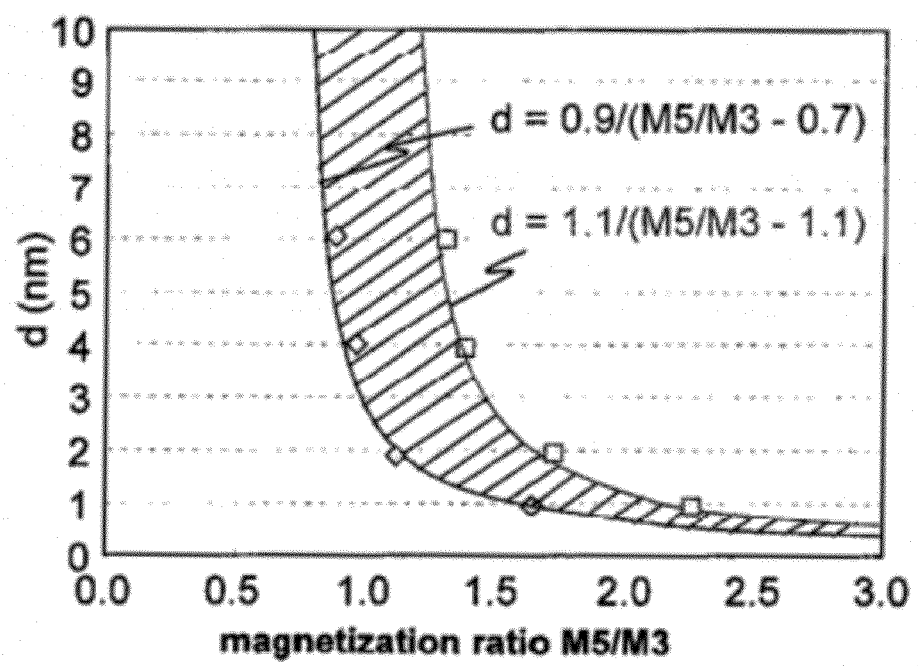
FIG. 8 is a view showing an example of a characteristic of the present invention.

FIG. 8 shows, by hatching, a range of the magnetization ratio M5/M3 in which the head SNR shown in FIG. 7 exhibits a high value compared to the related art when the distance "d" is changed. A lower limit of the relationship between the distance "d" which exhibits the high head SNR compared to the related art and the magnetization ratio is calculated by a formula d=0.9/(M5/M3−0.7), and an upper limit of the relationship is calculated by a formula d=1.1/(M5/M3−1.1). Accordingly, with the use of the magnetization stable layer which satisfies Equation 6, the mag-noise can be reduced without lowering the reproduction output thus realizing the acquisition of the high head SNR.

$$0.9/(M5/M3-0.7) \leq d \leq 1.1/(M5/M3-1.1) \qquad \text{Equation 6}$$

Figure 9:
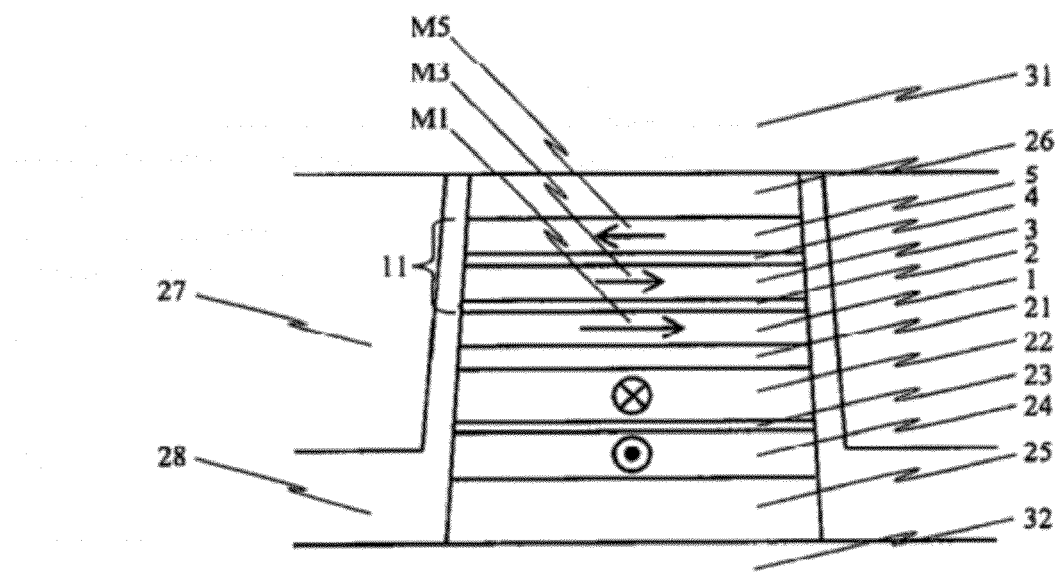
FIG. 9 is a view showing a constitutional example of the magnetoresistive head of the present invention.

FIG. 9 is a schematic view of another structure of the magnetoresistive magnetic head according to one embodiment as viewed from a plane which faces a recording medium.

An antiferromagnetic layer 25, a first magnetization pinned layer 24, a pinned-layer antiparallel coupling layer 23, a second magnetization pinned layer 22, a non-magnetic intermediate layer 21, a magnetization free layer 1, a non-magnetic coupling layer 2, a first ferromagnetic stable layer 3, an antiparallel coupling layer 4, a second ferromagnetic stable layer 5, and a protective layer 26 may be continuously formed, according to one embodiment.

The magnetization M1 of the magnetization free layer 1 and the magnetization M3 of the first ferromagnetic stable layer 3 are coupled in a ferromagnetic alignment by the non-magnetic coupling layer 2, while the magnetization M3 of the first ferromagnetic stable layer 3 and the magnetization M5 of the second ferromagnetic stable layer 5 are coupled in an antiferromagnetic alignment by the antiparallel coupling layer 4.

The non-magnetic coupling layer 2 may be made of Ru having a film thickness of about 0.6 nm for coupling the magnetization of the magnetization free layer 1 and the magnetization of the first ferromagnetic stable layer 3 in a ferromagnetic alignment. However, the non-magnetic coupling layer 2 may be made of a material such as Ir, Cr, Rh, Re, Os, Pt, Ta, or Cu having a properly selected thickness. The antiparallel coupling layer 4 may be made of Ru having a film thickness of about 0.4 nm for coupling the magnetization of the first ferromagnetic stable layer 3 and the magnetization of the second ferromagnetic stable layer 5 in an antiferromagnetic alignment. However, the antiparallel coupling layer 4 may be made of a material such as Ir, Cr, Rh, Re, Os, or Pt having a properly selected thickness.

Figure 10:
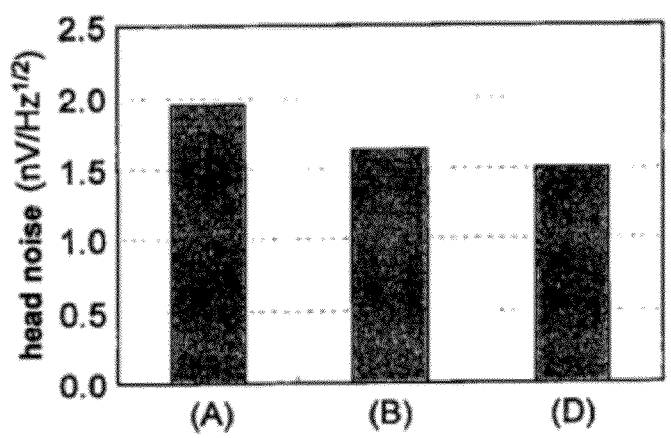
FIG. 10 is a view showing an example of a characteristic of the related art and an example of a characteristic of the present invention.

FIG. 10 shows one example of head noise in the related art and two structures according to some embodiments. (A) indicates one example of a structure of the related art having no magnetization stable layer, wherein the magnetization free layer has a film thickness of about 3 nm and a saturated magnetization of 1000 emu/cm$^3$. FIG. 3 is a schematic view of (A) as viewed from a surface thereof which faces a recording medium. (B) indicates one example of a structure according to one embodiment having the magnetization stable layer shown in FIG. 1, wherein the magnetization free layer has the same film thickness of about 3 nm as (A) and the same saturated magnetization of 1000 emu/cm$^3$ as (A), and both of the first ferromagnetic stable layer and the second ferromagnetic stable layer have a film thickness of about 2 nm and the saturated magnetization of 1000 emu/cm$^3$. The magnetization free layer and the first ferromagnetic stable layer are coupled to each other in an antiferromagnetic alignment by the non-magnetic coupling layer. (D) indicates one example of the head noise of a structure according to one embodiment shown in FIG. 9. The magnetization free layer has the same film thickness of about 3 nm as (A) and the same saturated magnetization of 1000 emu/cm$^3$ as (A), and both of the first ferromagnetic stable layer and the second ferromagnetic stable layer have a film thickness of about 2 nm and the saturated magnetization of 1000 emu/cm$^3$. The magnetization free layer and the first ferromagnetic stable layer are coupled to each other in a ferromagnetic alignment by the non-magnetic coupling layer.

The head noise of (D) which is a structure according to one embodiment is small compared to the head noise of (A) of the related art. The head noise of (D) which is a structure according to one embodiment is substantially equal to the head noise of (B) which is another structure according to one embodiment. This is because that (D) has the same alignment as (B), the magnetization M1 of the magnetization free layer and the magnetization M3 of the first ferromagnetic stable layer are magnetically coupled by way of the non-magnetic coupling layer and hence, the magnetizations M1, M3 integrally behave and, the magnetization M3 of the first ferromagnetic stable layer and the magnetization M5 of the second ferromagnetic stable layer are magnetically coupled by way of the antiparallel coupling layer and hence, the magnetizations M3, M5 integrally behave whereby the magnetizations M1, M3, M5 integrally behave. Accordingly, a value of V in Equation 3 of mag-noise in (D) becomes 7.3 times as large as a value of V of (A). As a result, mag-noise is lowered to $(1/7.3)^{1/2}$ and hence, head noise is lowered.

Figure 11:
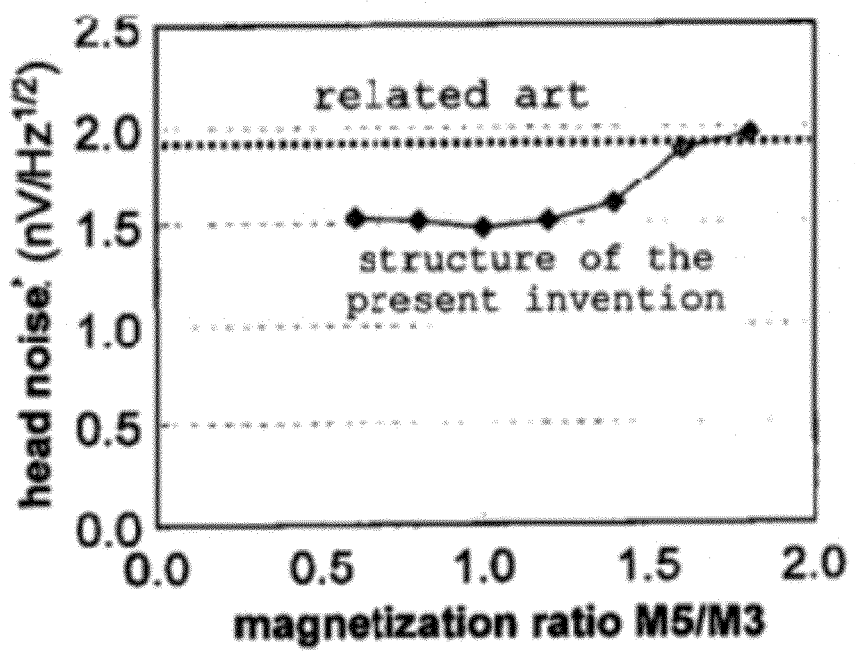
FIG. 11 is a view showing an example of a characteristic of the related art and an example of a characteristic of the present invention.

FIG. 11 shows a change of head noise when a ratio between the magnetization quantity M3 of the first ferromagnetic stable layer and the magnetization quantity M5 of the second ferromagnetic stable layer is changed. The magnetization quantity of each layer is expressed by a product of the saturated magnetization of a material which comprises each layer and a volume of the layer. Accordingly, the saturated magnetization of each layer may be changed, a film thickness of each layer may be changed, or both of the saturated magnetization and the film thickness may be changed. FIG. 11 shows a result when a distance between the second ferromagnetic stable layer 5 and the first magnetic shield 31 is set to about 4 nm. Further, in the drawing, there is also shown a value of head noise in a read head having a structure of the related art with no magnetization stable layer 11.

When the magnetization ratio M5/M3 between the first ferromagnetic stable layer 3 and the second ferromagnetic stable layer 5 is set to a value not more than about 1.4, head noise which is lower than the head noise of related art is observed. This is because, as described previously, the magnetization of the magnetization free layer 1, the magnetization of the first ferromagnetic stable layer 3, and the magnetization of the second ferromagnetic stable layer 5 are formed integrally according to one embodiment, and hence, the effective volume is increased whereby the mag-noise is reduced.

Even when the magnetization ratio M5/M3 is not less than 1, when the magnetization ratio M5/M3 is not more than 1.4, a portion of a static magnetic field generated from the track end of the second ferromagnetic stable layer 5 is attracted by the first magnetic shield 31 and hence, the second ferromagnetic stable layer 5 and the first ferromagnetic stable layer 3 form a closed magnetic circuit. However, when the magnetization ratio M5/M3 is not less than 1.4, the closed magnetic circuit collapses, and a magnitude of the static magnetic field applied to the track end of the second ferromagnetic stable layer 5 from the track end of the first ferromagnetic stable layer 3 becomes relatively small. That is, the magnetostatic coupling between the first ferromagnetic stable layer 3 and the second ferromagnetic stable layer 5 is weakened. A demagnetizing field is large at the track end so that the deterioration of the magnetostatic coupling at the track end is liable to deteriorate coupling between the first magnetization stable layer 3 and the second magnetization stable layer 5. The magnetization of the second ferromagnetic stable layer 5 is directed in the direction opposite to the direction of a magnetic field applied from the bias layer 27 and hence, the coupling is liable to be deteriorated particularly at the track end. In this manner, the magnetization free layer 1, the first ferromagnetic stable layer 3, and the second ferromagnetic stable layer 5 do not behave completely integrally and hence, the mag-noise is increased to a level substantially equal to a level of the related art.

When the magnetization quantity of the ferromagnetic stable layer 3 exceeds the first magnetization quantity of the second ferromagnetic stable layer 5, that is, when the magnetization ratio M5/M3 is less than 1, a magnitude of a static magnetic field applied to the second ferromagnetic stable layer 5 becomes relatively small. However, the magnetization direction of the first ferromagnetic stable layer 3 is equal to the direction of a magnetic field applied from the bias layer and hence, there is no possibility that the track end becomes unstable so that the mag-noise is increased.

Figure 12:
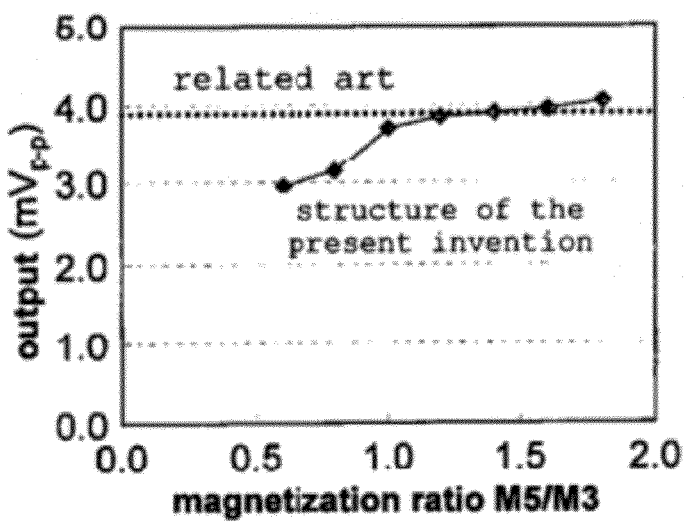
FIG. 12 is a view showing an example of a characteristic of the related art and an example of a characteristic of the present invention.

FIG. 12 shows a change of a reproduction output when the ratio between the magnetization quantity M3 of the first ferromagnetic stable layer 3 and the magnetization quantity M5 of the second ferromagnetic stable layer 5 is changed. FIG. 12 shows a result when a distance between the second ferromagnetic stable layer 5 and the first magnetic shield 31 is set to about 4 nm. Further, in the drawing, there is also shown a value of a reproduction output of a read head having a structure of the related art with no magnetization stable layer 11.

When the magnetization ratio M5/M1 becomes not more than 0.8, the reproduction output is lowered compared to the related art. When the magnetization quantity of the first stable layer 3 exceeds the magnetization quantity of the second ferromagnetic stable layer 5 so that the magnetization quantity of the first ferromagnetic stable layer 3 and the magnetization quantity of the second ferromagnetic stable layer 5 cannot offset each other, the magnetization direction of the first ferromagnetic stable layer 3 and the magnetization direction of the magnetization free layer are equal and hence, this implies that the magnetization quantity in the same direction as the magnetization direction of the magnetization free layer 1 is increased. As a result, the utilization ratio is lowered thus lowering an output.

In the same alignment as a previous embodiment, the smaller a distance "d" between the second magnetization stable layer 5 and the first magnetic shield 31, the larger a quantity of a static magnetic field which is generated from the track end of the second ferromagnetic stable layer b and the second magnetization stable layer 5 is attracted by the first magnetic shield 31. Accordingly, the magnetization ratio M5/M3 at which the head noise starts to increase and the magnetization ratio M5/M3 at which the output starts to decrease are increased.

Further, even when a track width or an element height is changed, the relationship between the magnetization ratio M5/M3 at which the head noise starts to increase and the distance "d", and the relationship between the magnetization ratio M5/M3 at which the output starts to decrease and the distance "d" are not changed. A factor which causes an increase of the noise is the lowering of the magnetostatic coupling at the track end. That is, only the magnetization which is generated at the track end matters. Further, a factor which causes the lowering of the output is that the magnetization of the first ferromagnetic stable layer 3 and the magnetization of the second ferromagnetic stable layer 5 do not substantially offset each other. That is, only the ratio between the magnetization of the first ferromagnetic stable layer 3 and the magnetization of the second ferromagnetic stable layer 5 matters. Accordingly, the lowering of the output does not depend on a length of the layer, that is, the track width or the element height. Further, only the magnetization ratio between the first ferromagnetic stable layer 3 and the second ferromagnetic stable layer 5 is important; therefore, lowering the output is not dependent on the magnetization quantity, the saturated magnetization, or the film thickness of the magnetization free layer 1.

Figure 13:
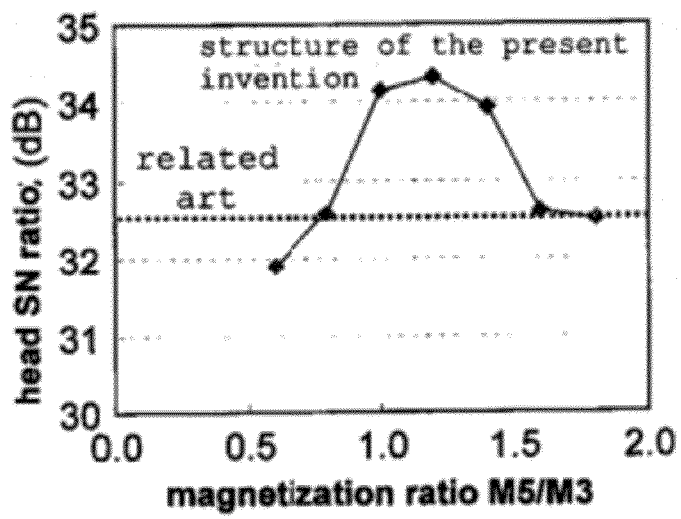
FIG. 13 is a view showing an example of a characteristic of the related art and an example of a characteristic of the present invention.

FIG. 13 shows the relationship between the head SNR calculated based on the noise shown in FIG. 11 and the output shown in FIG. 12 and the magnetization ratio M5/M3 (d=4 nm).

The head SNR is expressed by Equation 5, above.

A structure, according to one embodiment, exhibits a high head SNR compared to the related art having no magnetization stable layer when the magnetization ratio M5/M3 falls within a range from not less than 0.8 to not more than 1.4. It may be safe to say that this range is a range which allows the reduction of mag-noise without lowering the reproduction output, according to one embodiment. The first magnetization stable layer and the second magnetization layer form a closed magnetic circuit. When the magnetization of the first magnetization stable layer and the magnetization of the second magnetization stable layer effectively offset each other, the structure, according to one embodiment, can acquire the high head SNR compared to a structure of the related art.

Figure 14:
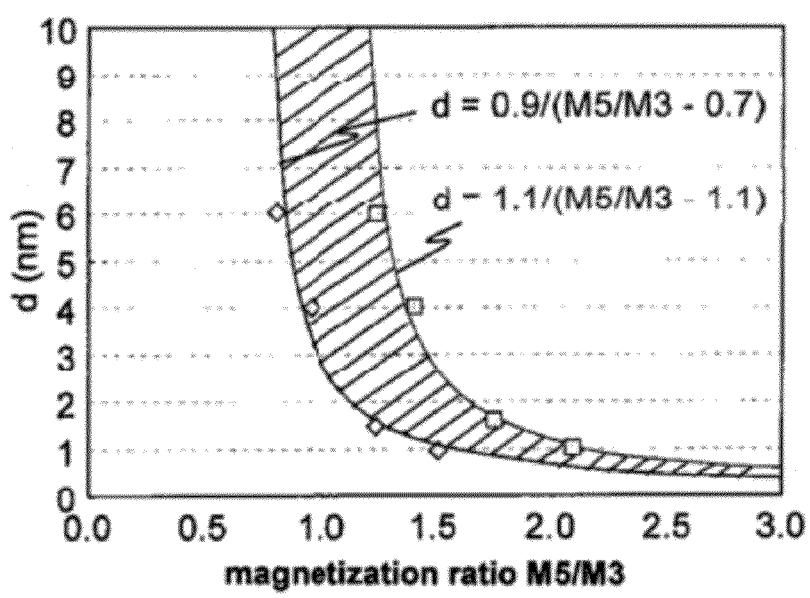
FIG. 14 is a view showing an example of a characteristic of the present invention.

FIG. 14 shows a range of the magnetization ratio M5/M3 in which the head SNR shown in FIG. 13 exhibits a high value compared to the related art when the distance "d" is changed to take various values by hatching. A lower limit of the relationship between the distance "d" which exhibits the high head SNR compared to the related art and the magnetization ratio is calculated by a formula d=0.9/(M5/M3−0.7), and an upper limit of the relationship is calculated by a formula d=1.1/(M5/M3−1.1). Accordingly, with the use of the magnetization stable layer which satisfies Equation 7, the mag-noise can be reduced without lowering the reproduction output, thus realizing the high head SNR.

$$0.9/(M5/M3-0.7) \leq d \leq 1.1/(M5/M3-1.1) \quad \text{Equation 7}$$

Figure 15:
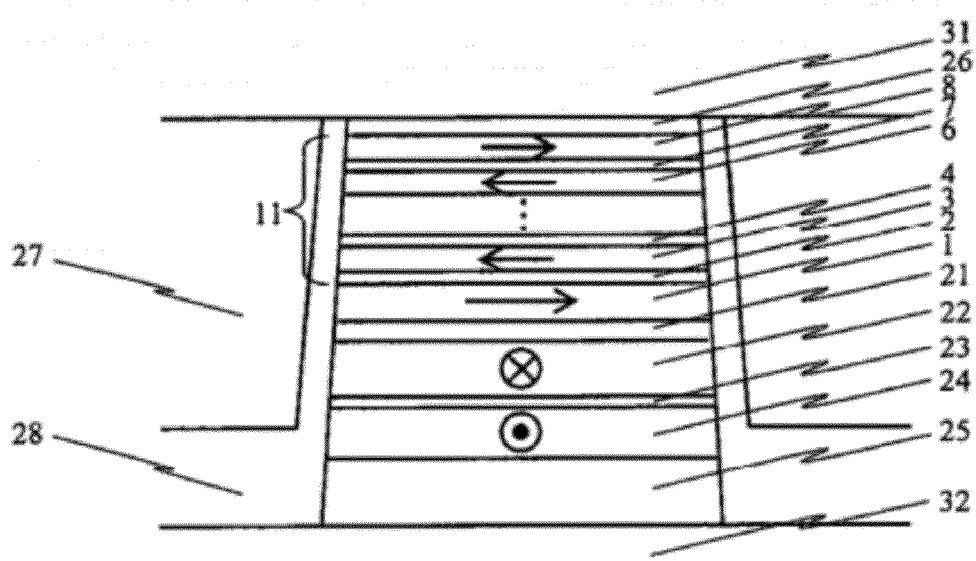
FIG. 15 is a view showing a constitutional example of the magnetoresistive head of the present invention.

FIG. 15 is a schematic view of another example of a magnetoresistive magnetic head, according to one embodiment, as viewed from a plane which faces a recording medium.

The magnetoresistive magnetic head comprises an antiferromagnetic layer 25, a first magnetization pinned layer 24, a pinned-layer antiparallel coupling layer 23, a second magnetization pinned layer 22, a non-magnetic intermediate layer 21, a magnetization free layer 1, and a magnetization stable layer 11. The magnetization stable layer 11 which is arranged adjacent to the magnetization free layer 1 is a stacked layer comprising n pieces of ferromagnetic layers and n pieces of non-magnetic layers. That is, the magnetization stable layer 11 may be formed, according to one embodiment, by stacking a non-magnetic coupling layer 2, a first ferromagnetic stable layer 3, a first antiparallel coupling layer 4, . . . , an (n-1)th ferromagnetic stable layer 6, an (n-1)th antiparallel coupling layer 7, and an nth ferromagnetic stable layer B. In some approaches, n may preferably be an even number. In another approach, n can be any number, such as 1, 3, 4, 10, 20, 50, etc. The magnetization free layer 1 and the first ferromagnetic stable layer 3 are coupled in an antiferromagnetic alignment by the non-magnetic coupling layer 2.

Even when the magnetization stable layer 11 is formed of the multi-layered structure comprising ferromagnetic bodies and the antiparallel coupling layers, according to one embodiment, the magnetization stable layer 11 satisfies the condition that the magnetization quantity of the whole magnetization stable layer is offset thus forming a closed magnetic circuit. Accordingly, assuming that the respective magnetization quantities of the respective layers ranging from the first magnetization stable layer 3 to the (n-1)th magnetization stable layer 6 are substantially equal and a distance between the nth magnetization stable layer 8 and the first magnetic shield 31 is set as d, the magnetization M6 of the (n-1)th magnetization stable layer 6 and the magnetization M7 of the nth magnetization stable layer 8 satisfy the following relationship, shown as Equation 8.

$$0.9/(M7/M6-0.7) \leq d \leq 1.1/(M7/M6-1.1) \quad \text{Equation 8}$$

Figure 16:
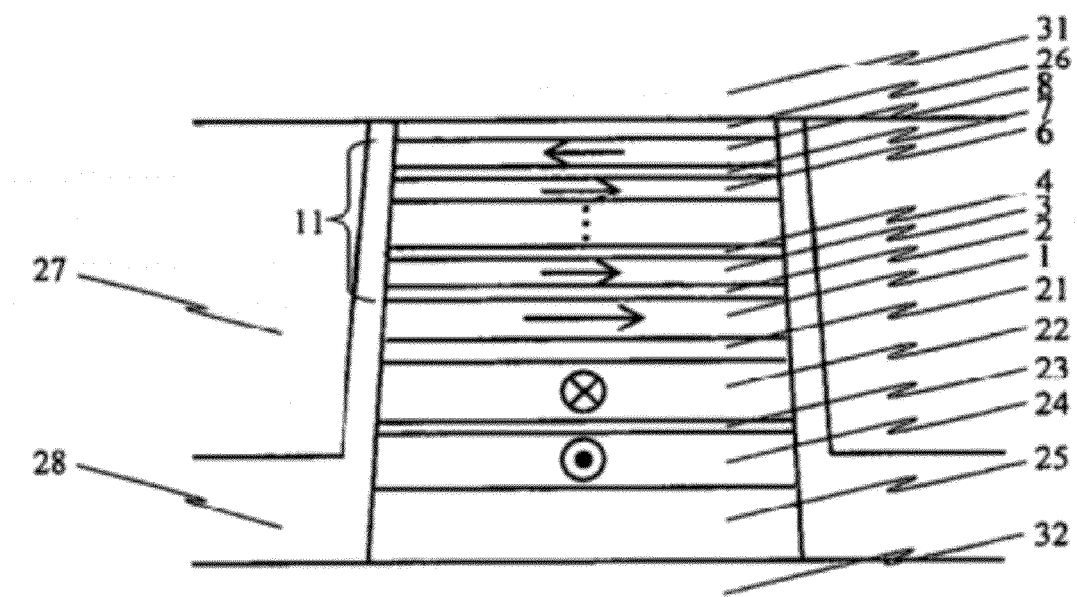
FIG. 16 is a view showing a constitutional example of the magnetoresistive head of the present invention.

FIG. 16 is a schematic view of another example of a magnetoresistive head, according to one embodiment, as viewed from a plane which faces a recording medium.

The magnetoresistive head comprises an antiferromagnetic layer 25, a first magnetization pinned layer 24, a pinned-layer antiparallel coupling layer 23, a second magnetization pinned layer 22, a non-magnetic intermediate layer 21, a magnetization free layer 1, and a magnetization stable layer 11. The magnetization stable layer 11 which is arranged adjacent to the magnetization free layer 1 is a stacked layer comprising n pieces of ferromagnetic layers and n pieces of non-magnetic layers. That is, the magnetization stable layer 11 may be formed, according to one embodiment, by stacking a non-magnetic coupling layer 2, a first ferromagnetic stable layer 3, a first antiparallel coupling layer 4, . . . , an (n-1)th ferromagnetic stable layer 6, an (n-1)th antiparallel coupling layer 7, and an nth ferromagnetic stable layer 8. According to some approaches, n may preferably be an even number. In more approaches, n may be any number, such as 1, 3, 5, 10, 20, 50, etc. The magnetization free layer 1 and the first ferromagnetic stable layer 3 are coupled in a ferromagnetic alignment by the non-magnetic coupling layer 2. Even when the magnetization stable layer 11 is formed of the multi-layered structure comprising ferromagnetic bodies and the antiparallel coupling layers, in the same alignment as the embodiment 2, the magnetization stable layer 11 satisfies the condition that the magnetization quantity of the whole magnetization stable layer is offset, thus forming a closed magnetic circuit. Accordingly, assuming that the respective magnetization quantities of the respective layers ranging from the first magnetization stable layer 3 to the (n-1)th magnetization stable layer 6 are substantially equal and a distance between the nth magnetization stable layer 8 and the first magnetic shield 31 is set as d, the magnetization M6 of the (n-1)th magnetization stable layer 6 and the magnetization M7 of the nth magnetization stable layer 8 satisfy Equation 9, below.

$$0.9/(M7/M6-0.7) \leq d \leq 1.1/(M7/M6-1.1) \quad \text{Equation 9}$$

Figure 17:
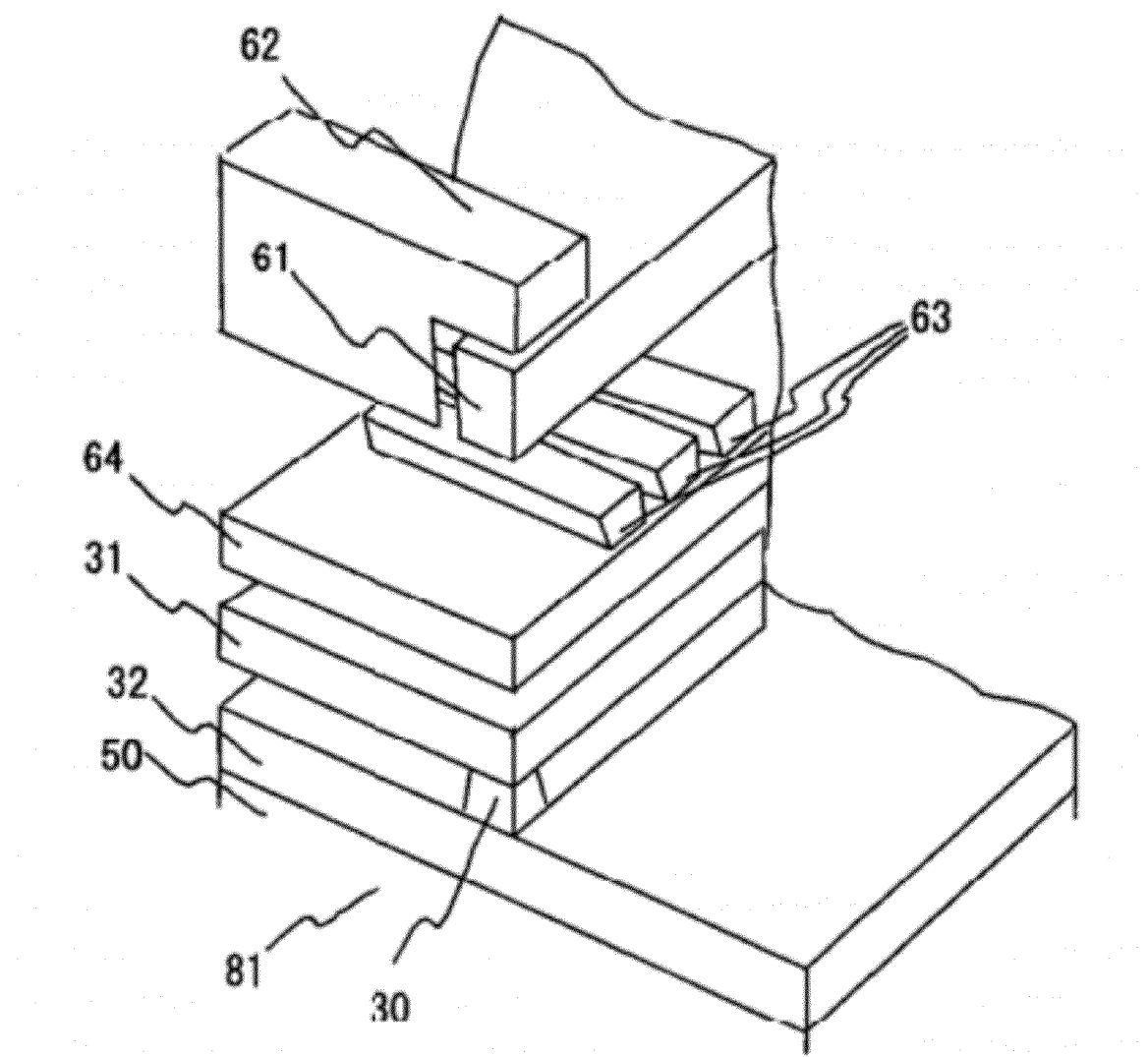
FIG. 17 is a view showing a constitutional example of a recording-reproduction separation-type magnetic head for vertical recording.

FIG. 17 is a conceptual view showing a case in which a magnetic head according to one embodiment on which a magnetoresistive effect film is mounted is used in a vertical magnetic recording device. On a base body 50 which also functions as a slider, the second magnetic shield 32, the magnetoresistive effect stacked film 30, the first magnetic shield 31, a sub magnetic pole 64, coils 63, a main magnetic pole 61, and a wrap-around shield 62 which comprise a magnetic shield surrounding the main magnetic pole may be formed. The magnetic head forms an oppositely-facing surface 81. In the drawing, the magnetic head is configured to include the first magnetic shield and the sub magnetic pole. However, according to one embodiment, even when the magnetic head is configured such that either one of the first magnetic shield and the sub magnetic pole functions also as another, the magnetic head may still perform as described herein. Further, even when the magnetic head adopts a structure which has no wrap-around shield 62, the magnetic head may still perform as described herein.

Figure 18:
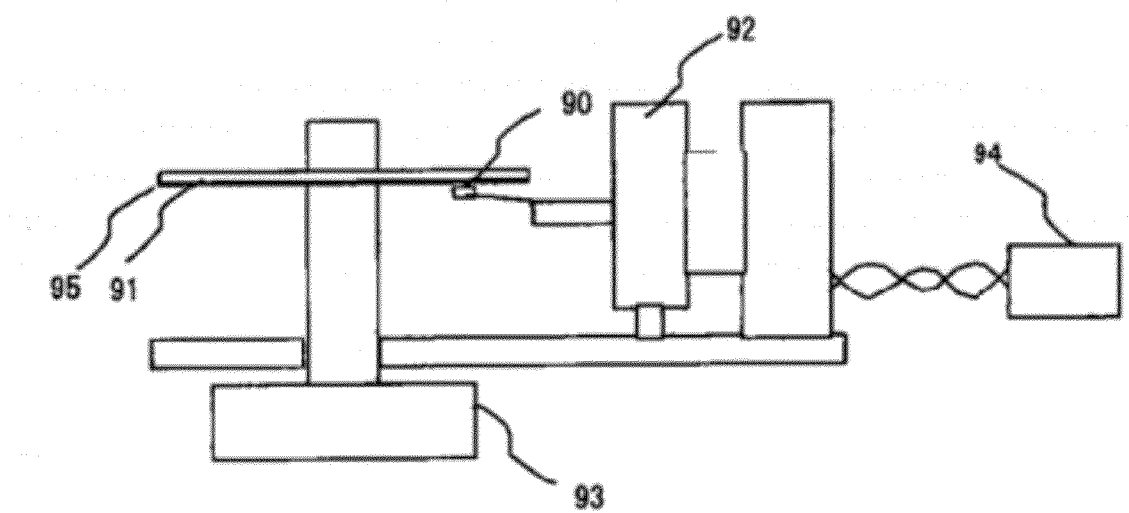
FIG. 18 is a view showing a constitutional example of a magnetic recording/reproducing device.

FIG. 18 shows another example of a magnetic storage device, according to one embodiment, which uses vertical magnetic recording. A disk 91 holding a recording medium 95 which records information magnetically is rotated by a spindle motor 93, and a head slider 90 is guided to a position over a track of the disk 91 by an actuator 92. That is, in the magnetic disk device, a read head and a recording head which are formed on the head slider 90 approach a predetermined recording position over the disk 91 due to such a mechanism, and perform a relative motion thus sequentially writing or reading signals. In some approaches, the actuator 92 may preferably be a rotary actuator. Recording signals are transmitted through a signal processing system 94 and are recorded on the medium by the recording head, while an output of the read head is acquired as signals through the signal processing system 94. Further, in moving the read head to a position over a desired recording track, the position over the track is detected using a high-sensitive output from the read head, and the actuator is controlled in response to the detected position thus performing the positioning of the head slider 90. In the drawing, the number of head slider 90 and the number of the disk 91 is one respectively. However, a plurality of head sliders 90 or a plurality of disks 91 may be used. Further, the disk 91 may have the recording medium 95 on both surfaces thereof for recording information. When information is recorded on both surfaces of the disk 91, the head slider 90 is arranged over both surfaces of the disk 91.

Tests have been carried out on a magnetic head designed according to one embodiment, and the magnetic storage device on which the magnetic head is mounted with respect to the above-mentioned magnetic storage device design. A result of tests shows that mag-noise can be reduced and, at the same time, a head SNR can be enhanced. A structure, according to one embodiment, is applicable to a CIP or CPP magnetic sensor or magnetic head which uses a GMR effect, and a magnetic sensor or a magnetic head which uses a TMR effect.

It should be noted that methodology presented herein for at least some of the various embodiments may be implemented, in whole or in part, in computer hardware, software, by hand, using specialty equipment, etc., and combinations thereof.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic read head comprising a magnetoresistive sensor, wherein the magnetoresistive sensor has a laminated structure which comprises:
   a magnetization pinned layer;
   an antiferromagnetic layer for pinning a magnetization of the magnetization pinned layer;
   a non-magnetic intermediate layer;
   a magnetization free layer; and
   a magnetization stable layer;
   wherein the magnetization stable layer comprises:
      a non-magnetic coupling layer;
      a first ferromagnetic stable layer;
      an antiparallel coupling layer; and
      a second ferromagnetic stable layer;
   wherein a magnetization of the first ferromagnetic stable layer and a magnetization of the second ferromagnetic stable layer are coupled in an antiparallel alignment by the antiparallel coupling layer,
   wherein magnetization quantities of the first ferromagnetic stable layer and magnetization quantities of the second ferromagnetic stable layer are substantially equal,
   wherein the antiferromagnetic layer is the only layer of antiferromagnetic material in the laminated structure,
   wherein a magnetization of the magnetization free layer and a magnetization of the first ferromagnetic stable layer are coupled in a parallel or an antiparallel alignment by the non-magnetic coupling layer.

2. A magnetic read head according to claim 1, wherein a magnetization of the magnetization free layer and a magnetization of the first ferromagnetic stable layer are coupled in an antiparallel alignment by the non-magnetic coupling layer.

3. A magnetic read head according to claim 2, wherein the non-magnetic coupling layer and the antiparallel coupling layer comprise a material selected from a group consisting of Ru, Ir, Cr, Rh, Re, Os, and Pt.

4. A magnetic read head according to claim 1, wherein a magnetization of the magnetization free layer and a magnetization of the first ferromagnetic stable layer are coupled in a parallel alignment by the non-magnetic coupling layer.

5. A magnetic read head according to claim 4, wherein the non-magnetic coupling layer and the antiparallel coupling layer comprise a material selected from a group consisting of Ru, Ir, Cr, Rh, Re, Os, Pt, Ta, and Cu.

6. A system, comprising:
   a magnetic read head according to claim 1;
   a recording medium; and
   an actuator for positioning the magnetic read head over the recording medium.

7. A magnetic read head, comprising:
   a magnetoresistive sensor; and
   a first magnetic shield and a second magnetic shield which are positioned such that the magnetoresistive sensor is therebetween,
   wherein the magnetoresistive sensor has a laminated structure comprising:
      a magnetization pinned layer;
      a non-magnetic intermediate layer;
      a magnetization free layer; and
      a magnetization stable layer,
   wherein the magnetization stable layer comprises:
      a non-magnetic coupling layer;
      a first ferromagnetic stable layer;

an antiparallel coupling layer; and
a second ferromagnetic stable layer,
wherein a magnetization of the first ferromagnetic stable layer and a magnetization of the second ferromagnetic stable layer are coupled in an antiparallel alignment by the antiparallel coupling layer, and
wherein the first magnetic shield is closer to the magnetization free layer,
wherein the second magnetic shield is closer to the magnetization pinned layer,
wherein a distance between the first magnetic shield and the second ferromagnetic stable layer is d, a magnetization of the first ferromagnetic stable layer is M3, and a magnetization of the second ferromagnetic stable layer is M5, and $0.9/(M5/M3-0.7) \leq d \leq 1.1/(M5/M3-1.1)$ is satisfied.

8. A magnetic read head according to claim 7, wherein a magnetization of the magnetization free layer and a magnetization of the first ferromagnetic stable layer are coupled in an antiparallel alignment by the non-magnetic coupling layer.

9. A magnetic read head according to claim 8, wherein the non-magnetic coupling layer and the antiparallel coupling layer comprise a material selected from a group consisting of Ru, Ir, Cr, Rh, Re, Os, and Pt.

10. A magnetic read head according to claim 7, wherein a magnetization of the magnetization free layer and a magnetization of the first ferromagnetic stable layer are coupled in a parallel alignment by the non-magnetic coupling layer.

11. A magnetic read head according to claim 10, wherein the non-magnetic coupling layer and the antiparallel coupling layer comprise a material selected from a group consisting of Ru, Ir, Cr, Rh, Re, Os, Pt, Ta, and Cu.

12. A system, comprising:
a magnetic read head according to claim 7;
a recording medium; and
an actuator for positioning the magnetic read head over the recording medium.

13. A magnetic read head, comprising:
a magnetoresistive sensor; and
a first magnetic shield and a second magnetic shield which are positioned such that the magnetoresistive sensor is therebetween,
wherein the magnetoresistive sensor has a laminated structure comprising:
a magnetization pinned layer;
a non-magnetic intermediate layer;
a magnetization free layer; and
a magnetization stable layer,
wherein the magnetization stable layer comprises:
a non-magnetic coupling layer;
a first ferromagnetic stable layer; and
a plurality of laminate layers formed adjacent the first ferromagnetic stable layer, each laminate layer comprising:
an antiparallel coupling layer; and
a ferromagnetic stable layer, wherein each antiparallel coupling layer is positioned between neighboring ferromagnetic stable layers,
wherein a magnetization of the neighboring ferromagnetic stable layers are coupled in an antiparallel alignment by the antiparallel coupling layer, and
wherein respective magnetization quantities of all ferromagnetic stable layers are substantially equal,
wherein the first magnetic shield is closer to the magnetization free layer,
wherein the second magnetic shield is closer to the magnetization pinned layer,
wherein a distance between the first magnetic shield and a ferromagnetic stable layer farthest from the non-magnetic coupling layer is d, a magnetization of the ferromagnetic stable layer second farthest from the non-magnetic coupling layer is M6, and a magnetization of the ferromagnetic stable layer farthest from the non-magnetic coupling layer is M7, and $0.9/(M7/M6-0.7) \leq d \leq 1.1/(M7/M6-1.1)$ is satisfied.

14. A magnetic read head according to claim 13, wherein the magnetization free layer and the first ferromagnetic stable layer are coupled to each other by way of the non-magnetic coupling layer such that a magnetization of the magnetization free layer and a magnetization of the first ferromagnetic stable layer are antiparallel to each other.

15. A magnetic read head according to claim 13, wherein the magnetization free layer and the first ferromagnetic stable layer are coupled to each other by way of the non-magnetic coupling layer such that a magnetization of the magnetization free layer and a magnetization of the first ferromagnetic stable layer are parallel to each other.

16. A system, comprising:
a magnetic read head according to claim 13;
a recording medium; and
an actuator for positioning the magnetic read head over the recording medium.

\* \* \* \* \*

UNITED STATES PATENT AND TRADEMARK OFFICE
CERTIFICATE OF CORRECTION

PATENT NO. : 8,223,463 B2
APPLICATION NO. : 12/579854
DATED : July 17, 2012
INVENTOR(S) : Katada et al.

It is certified that error appears in the above-identified patent and that said Letters Patent is hereby corrected as shown below:

In the specification:

col. 2, line 65, replace "$\leqq d \leqq$" with -- $\leq d \leq$ --;

col. 3, line 21, replace "$\leqq d \leqq$" with -- $\leq d \leq$ -- ;

col. 3, line 54, replace "$\leqq d \leqq$" with -- $\leq d \leq$ --;

col. 4, line 20, replace "$\leqq d \leqq$" with -- $\leq d \leq$ --;

col. 6, line 24, replace "$\leqq d \leqq$" with -- $\leq d \leq$ --;

col. 6, line 48, replace "$\leqq d \leqq$" with -- $\leq d \leq$ --;

col. 7, line 13, replace "$\leqq d \leqq$" with -- $\leq d \leq$ --;

col. 7, line 46, replace "$\leqq d \leqq$" with -- $\leq d \leq$ --;

col. 10, line 16, replace in Equation (1) "$\leqq d \leqq$" with -- $\leq d \leq$ --;

col. 11, line 61, replace "four-ormore-layered" with --four-or-more-layered--;

col. 12, line 43, in Equation (2) replace "Nc" with --Ne--;

col. 12, line 44, replace "Nc indicates" with --Ne indicates--;

col. 12, line 44 and 45, replace "Nc corresponds" with --Ne corresponds--;

col. 12, line 57, replace "a" with -- α --;

col. 16, line 9, in Equation (5) replace "Nb" with --Nh--;

col. 16, line 29, in Equation (6) replace "$\leqq d \leqq$" with -- $\leq d \leq$ --;

col. 19, line 60, in Equation (7), replace "$\leqq d \leqq$" with -- $\leq d \leq$ --;

col. 20, line 33, in Equation (8) replace "$\leqq d \leqq$" with -- $\leq d \leq$ --;

Signed and Sealed this
Twentieth Day of November, 2012

David J. Kappos
*Director of the United States Patent and Trademark Office*

CERTIFICATE OF CORRECTION (continued)
U.S. Pat. No. 8,223,463 B2

In the specification:

col. 21, line 4, in Equation (9) replace "$\leqq d \leqq$" with -- $\leq d \leq$ --;

In the claims:

col. 23, claim 7, line 15, replace "$\leqq d \leqq$" with -- $\leq d \leq$ --;

col. 24, claim 13, line 28, replace "$\leqq d \leqq$" with -- $\leq d \leq$ --.